(12) United States Patent
Tokuyama

(10) Patent No.: US 9,826,669 B2
(45) Date of Patent: *Nov. 21, 2017

(54) LIQUID CRYSTAL DISPLAY DEVICE HAVING A REARWARD BOTTOM SURFACE FOR IMPROVED HEAT DISSIPATION

(71) Applicant: Japan Display Inc., Tokyo (JP)

(72) Inventor: Hiroshi Tokuyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/366,693

(22) Filed: Dec. 1, 2016

(65) Prior Publication Data
US 2017/0086337 A1 Mar. 23, 2017

Related U.S. Application Data

(63) Continuation of application No. 14/631,606, filed on Feb. 25, 2015, now Pat. No. 9,545,039.

(30) Foreign Application Priority Data

Mar. 5, 2014 (JP) .................................. 2014-043065

(51) Int. Cl.
  *H05K 7/20* (2006.01)
  *G02F 1/1333* (2006.01)
  *G02F 1/1335* (2006.01)

(52) U.S. Cl.
  CPC ... *H05K 7/20963* (2013.01); *G02F 1/133308* (2013.01); *G02F 1/133603* (2013.01); *G02F 1/133621* (2013.01); *G02F 2001/133314* (2013.01); *G02F 2001/133628* (2013.01)

(58) Field of Classification Search
  CPC .... G06F 17/279; G06F 17/24; G06F 17/2705; G06F 17/278; H04L 51/32; H04L 51/04; H04L 67/306; G02F 1/1333; G02F 1/1335

See application file for complete search history.

(56) References Cited

U.S. PATENT DOCUMENTS 9,500,798 B2* 11/2016 Tokuyama ........... G02B 6/0031
9,545,039 B2* 1/2017 Tokuyama ......... H05K 7/20963
2013/0308340 A1 11/2013 Que et al.

FOREIGN PATENT DOCUMENTS

JP 2008-251245 A 10/2008

* cited by examiner

*Primary Examiner* — Tracie Y Green
(74) *Attorney, Agent, or Firm* — Typha IP LLC

(57) ABSTRACT

A liquid crystal display device includes a display panel having a display surface, a light source substrate, a heat sink, and a frame having a bottom surface. The light source substrate is arranged in a rearward direction opposite to a display direction of the display panel. The light source substrate has on it a light source that illuminates the display panel. The heat sink is arranged in the rearward direction from the light source substrate. The heat sink has a base attached to the light source substrate and fins each extending in the rearward direction from the base, to dissipate heat generated in the light source. The bottom surface is arranged in the rearward direction from the base. The bottom surface has a plurality of stirs into which the fins are inserted. The frame houses the light source substrate and the heat sink.

14 Claims, 7 Drawing Sheets

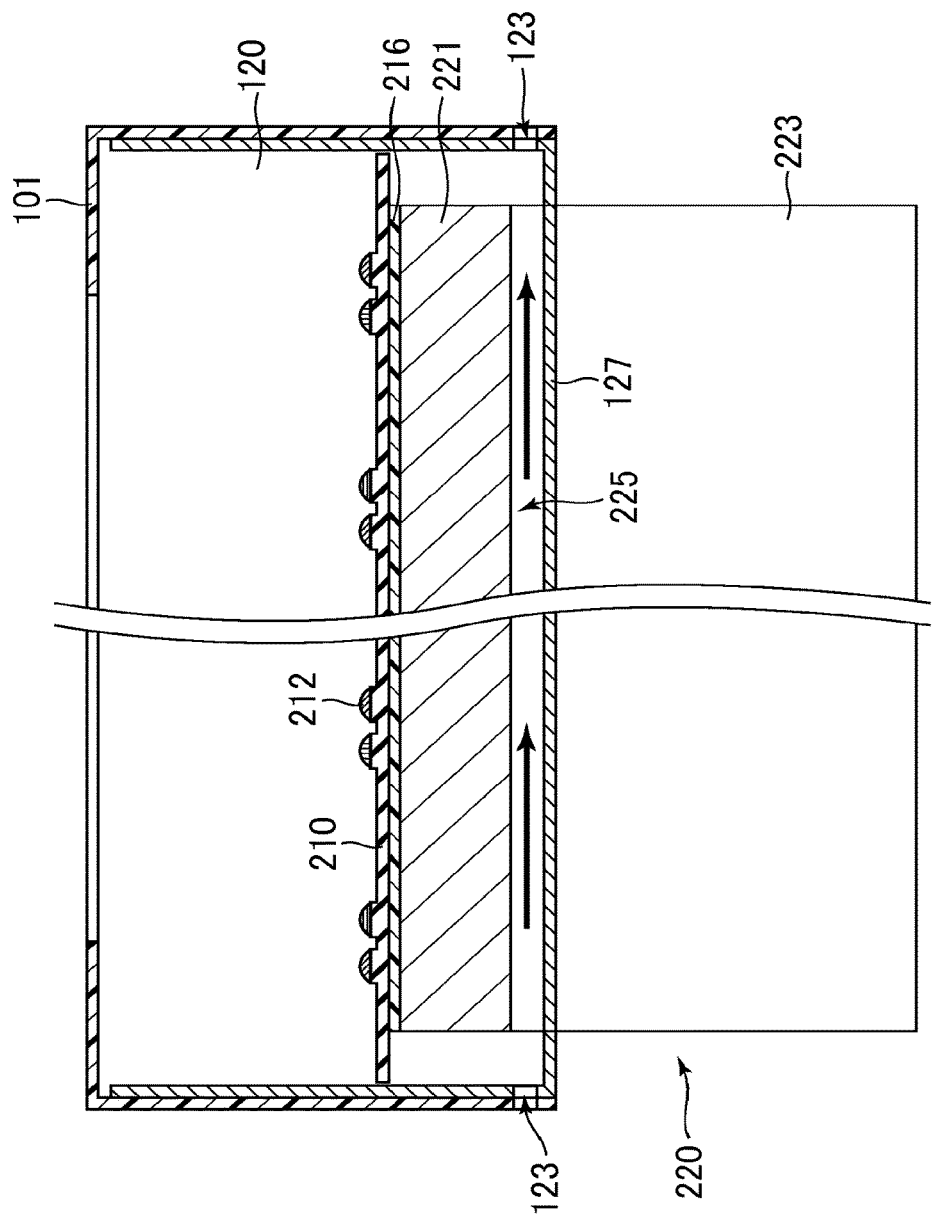

LIQUID CRYSTAL DISPLAY DEVICE HAVING A REARWARD BOTTOM SURFACE FOR IMPROVED HEAT DISSIPATION

CROSS-REFERENCE TO RELATED APPLICATIONS

This application is a continuation of U.S. application Ser. No. 14/631,606 filed on Feb. 25, 2015. Further, this application claims priority from Japanese application No. 2014-43065 filed on Mar. 5, 2014, the contents of which are hereby incorporated by reference into this application.

BACKGROUND OF THE INVENTION

1. Field of the Invention

The present invention relates to a liquid crystal display device.

2. Description of the Related Art

Liquid crystal display devices are widely used as a thin display device employed in information communication terminals or televisions. Such a liquid crystal display device is configured to change the orientation of liquid crystal composition sandwiched between two substrates by changing an electric field generated by a potential difference between a pixel electrode and a counter electrode, thus controlling the transmission of light emitted from a backlight unit to display images.

Cold cathode fluorescent lamps have been used for a backlight source, whereas light-emitting diodes are often used in recent years.

JP 2008-251245 A discloses a direct-lit backlight, including light-emitting diodes, in which a heat radiation block is located in an aperture of a lamp housing.

Light-emitting diodes used for liquid crystal display devices generate more heat as their brightness increases. The heat generated by the light-emitting diodes, which increases the ambient temperature, may affect the chromaticity and the brightness of the diodes themselves as well as the operation of an integrated circuit (IC) that controls the diodes. Moreover, driving the light-emitting diodes and the IC under high temperature may accelerate their deterioration and shorten the useful life of liquid crystal display devices.

SUMMARY OF THE INVENTION

The present invention has been made in view of the above circumstances. It is an object of the invention to provide a liquid crystal display device that can more efficiently dissipate heat generated from a backlight source.

A liquid crystal display device according to an aspect of the present invention includes a display panel having a display surface, a light source substrate, a heat sink, and a frame having a bottom surface. The light source substrate is arranged in a rearward direction opposite to a display direction of the display panel. The light source substrate has on it a light source that illuminates the display panel. The heat sink is arranged in the rearward direction from the light source substrate. The heat sink has a base attached to the light source substrate and a plurality of fins each extending in the rearward direction from the base, to dissipate heat generated in the light source. The bottom surface is arranged in the rearward direction from the base of the heat sink. The bottom surface has a plurality of slits into which the plurality of fins are inserted. The frame houses the light source substrate and the heat sink.

In the liquid crystal display device according to the aspect, the base of the heat sink may be separated from the bottom surface of the frame by a gap so that the heat sink and the frame, combined with each other, define a tunnel-shaped duct. The frame may have air vents, corresponding to both edges of the duct, in side surfaces adjoining the bottom surface.

In the liquid crystal display device according to the aspect, the fins of the heat sink may extend and taper down in the rearward direction, and the duct may be defined by the fins fitted and fixed into the slits.

In the liquid crystal display device according to the aspect, the plurality of fins and the frame may be fixed together by a snap-fit.

In the liquid crystal display device according to the aspect, the light source may include a red (R) light-emitting diode, two green (G) light-emitting diodes, and a blue (B) light-emitting diode, and the four RGGB light-emitting diodes may constitute a light-emitting diode group. The light source substrate may have a plurality of light-emitting diode groups on the light source substrate.

In the liquid crystal display device according to the aspect, each of the plurality of fins may extend through the corresponding one of the slits.

BRIEF DESCRIPTION OF THE DRAWINGS

FIG. 7 is a diagram for explaining how the liquid crystal display device dissipates heat.

DETAILED DESCRIPTION OF THE INVENTION

Embodiments of the present invention will be described below with reference to the accompanying drawings. The disclosure herein is merely an example, and any modification coming within the spirit of the present invention and obvious to those skilled in the art is intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
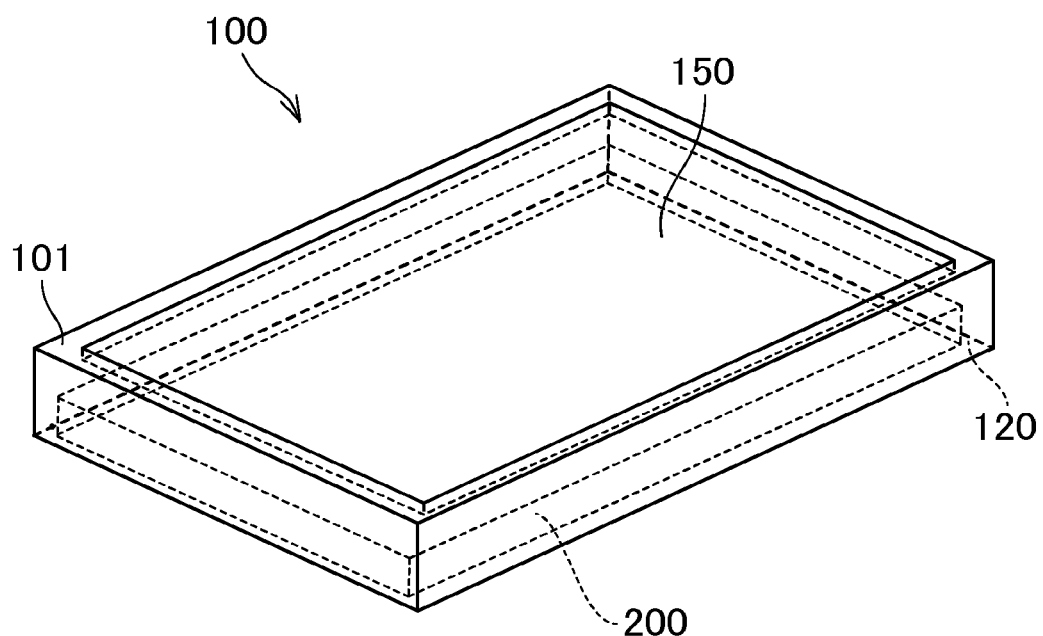
FIG. 1 is a diagram schematically showing a liquid crystal display device according to an embodiment of the present invention.

FIG. 1 schematically shows a liquid crystal display device 100 according to an embodiment of the present invention. As shown in the figure, the liquid crystal display device 100 includes a liquid crystal display panel 150, a mold frame 101 fixing the liquid crystal display panel 150, a backlight unit 200 that illuminates the liquid crystal display panel 150 from behind, and a frame 120 housing the backlight unit 200. Such a configuration is shown in this embodiment, whereas the frame 120 or other housings may house both of the liquid crystal display panel 150 and the backlight unit 200 without the mold frame 101.

Figure 2:
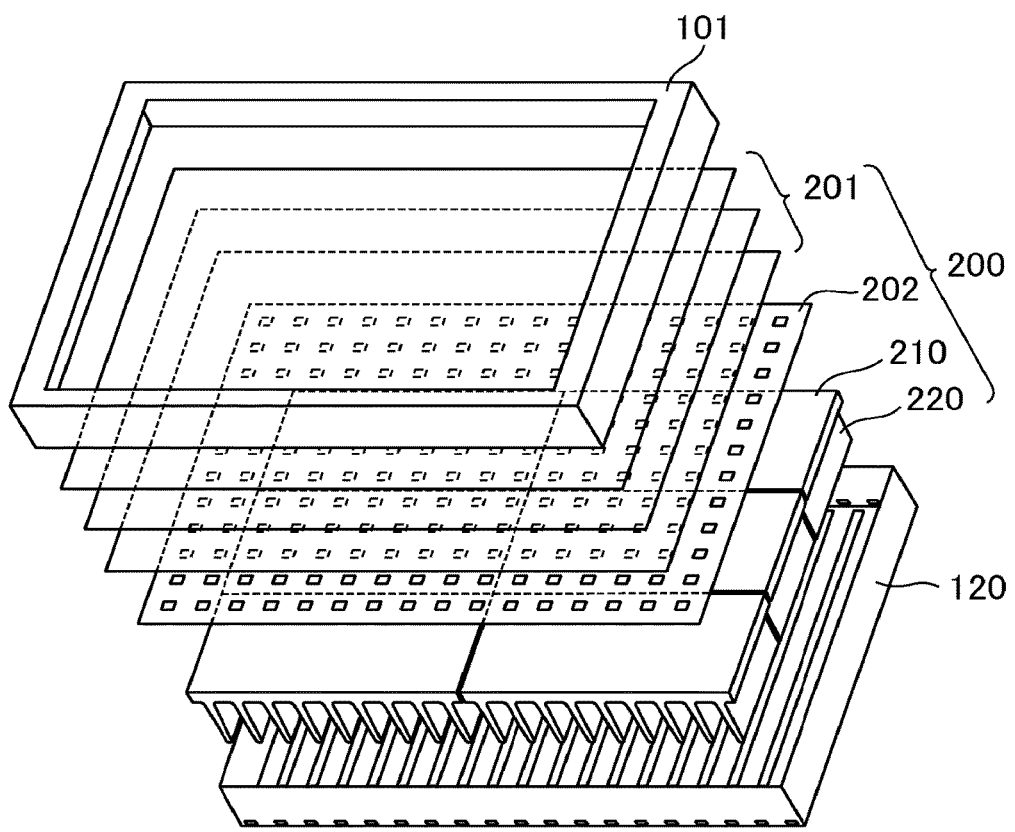
FIG. 2 is an exploded perspective view showing a mold frame, components of a backlight unit, and a frame, which are seen in FIG. 1.

FIG. 2 is an exploded perspective view showing the mold frame 101, components of the backlight unit 200, and the frame 120, which are seen in FIG. 1. In this figure, the liquid crystal display panel 150 is not shown for clarity of illustration. As shown in the figure, the backlight unit 200, arranged between the mold frame 101 and the frame 120, has light source substrates 210, a reflective sheet 202, an optical sheet 201, and heat sinks 220. The light source substrates 210 each have light-emitting diodes (LEDs) 212 (see FIG. 4) arranged on them as light sources. The reflective sheet 202, arranged on the light source substrates 210, reflects light directed toward the light source substrates 210 to redirect the light toward the liquid crystal display panel 150. The optical sheet 201 is composed of a plurality of sheet-shaped members that are configured, for example, to diffuse, concentrate, and polarize light emitted from the LEDs 212. The heat sinks 220, arranged in the rearward direction from the light source substrates 210, dissipate heat emitted from the LEDs 212. The reflective sheet 202 has openings therein corresponding to the positions where the LEDs 212 are arranged. Consequently, each LED 212 is arranged closer to the liquid crystal display panel 150 than the reflective sheet 202.

Figure 3:
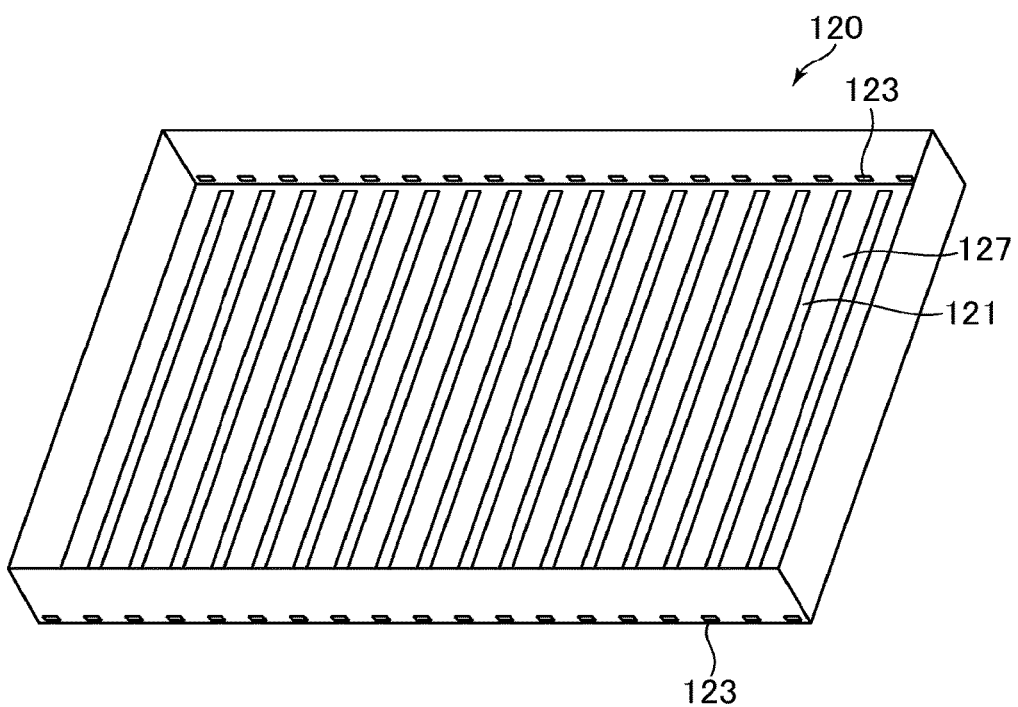
FIG. 3 is a perspective view showing the frame seen in FIG. 2.

FIG. 3 is a perspective view showing the frame 120 seen in FIG. 2. As shown in the figure, the frame 120 is shaped to have a rectangular bottom surface 127, having two long sides and two short sides, and four side surfaces sharing the four sides with the bottom surface 127, to house the light source substrates 210 and other components. The bottom surface 127 has a plurality of elongated slits 121 formed side by side along the short sides. The side surfaces facing in the longitudinal direction of the slits 121, that is, the side surfaces each having one of the long sides of the bottom surface 127 as their bottom side, each have a plurality of air vents 123 in them. The slits 121 in this embodiment extend along the short sides, whereas the slits 121 may elongate along the long sides, or have a curved shape or other shapes. In most cases, the slits 121 are formed so as to conform to the shape of fins 223 described below.

Figure 4:
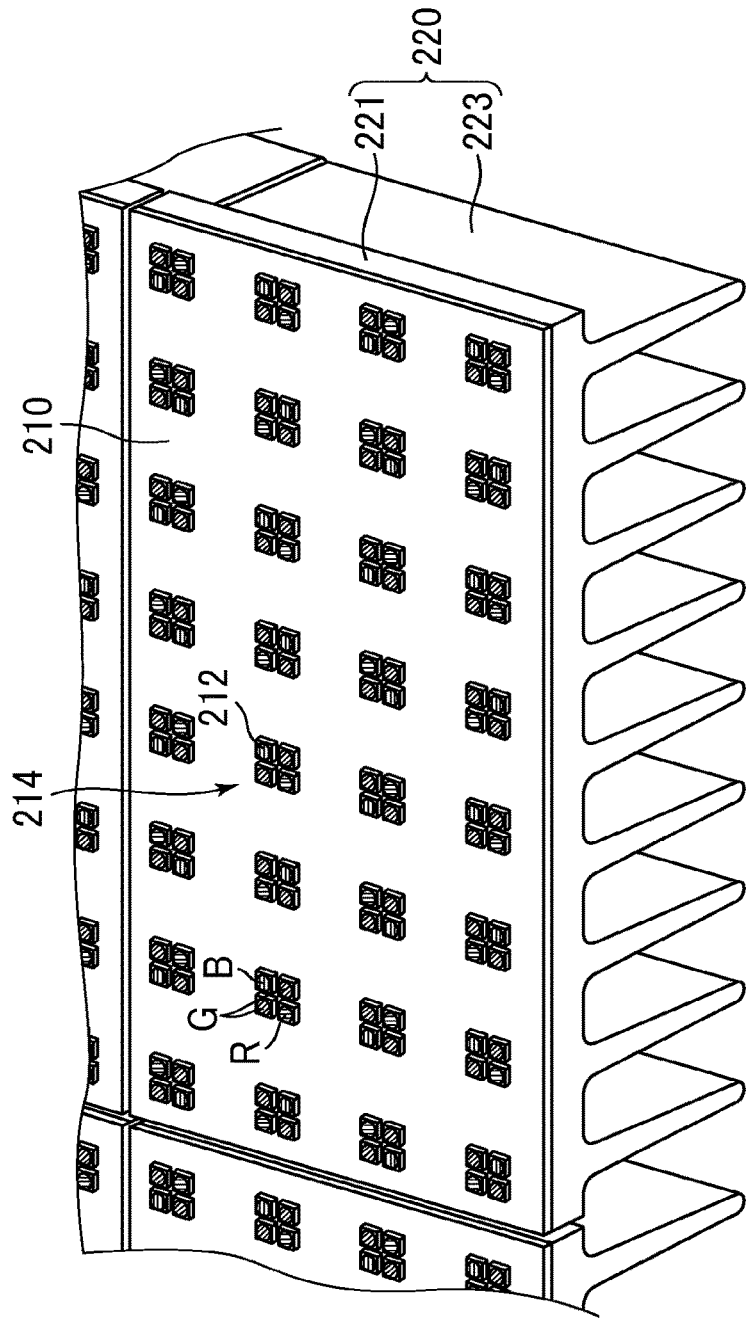
FIG. 4 is a perspective view showing a portion of light source substrates and heat sinks.

FIG. 4 is a perspective view showing a portion of the light source substrates 210 and the heat sinks 220. As shown in the figure, the LEDs 212, light sources for illuminating the liquid crystal display panel 150, are arranged on the light source substrates 210. The LEDs 212 in this embodiment have three colors: red, green, and blue. One red LED 212, two green LEDs 212, and one blue LED 212, four LEDs 212 in total, constitute one LED group 214, in which each of the two green LEDs 212 is arranged adjacent to both of the red LED 212 and the blue LED 212. A plurality of such LED groups 214 are evenly spaced across a light-emitting area. Such a configuration can expand the color gamut, especially in green and red directions, compared with white light-emitting devices using blue LEDs and yttrium aluminum garnet (YAG) phosphors or using blue LEDs and red-green (RG) phosphors, thus improving the color reproducibility and the display quality of the liquid crystal display device 100. In addition to expanding the color gamut, this arrangement of the LED groups 214 can strike a balance between the brightness of the colors, and mix the colors. The combination of colors for the LEDs 212 is not limited to these three colors. Alternatively, the LEDs 212 may have one, two, four or more colors, or be combined with phosphors, which may be optionally determined.

The heat sink 220, in contact with the entire back surface of the light source substrate 210, includes a base 221 that absorbs heat from the light source substrates 210, and a plurality of fins 223 expanding the surface area of the heat sink 220 to increase heat dissipation. The light source substrate 210 and the heat sink 220 may sandwich a thermally conductive material 216 (see FIG. 5), such as a resin containing glass filler, between them. In this embodiment, the fins 223, evenly spaced side by side, are each shaped to extend rearward from the base 221 and along the short sides of the bottom surface 127 of the frame 120. Alternatively, each fin 223 may extend along the long sides of the bottom surface 127 or have a curved shape. The fins 223 are appropriately formed so as to obtain a desired heat dissipation and in accordance with the shape of a region to accommodate the heat sinks 220. As shown in the figure, the liquid crystal display device 100 in this embodiment includes the plurality of light source substrates 210 and heat sinks 220 arranged corresponding to a plurality of subareas which the light-emitting area are divided into. Alternatively, the liquid crystal display device 100 may include one light source substrate 210 and one heat sink 220. It is appropriately determined, in accordance with a screen size or other structural requirements for its surroundings, how many light source substrates 210 and heat sinks 220 the liquid crystal display device 100 includes.

Figure 5:
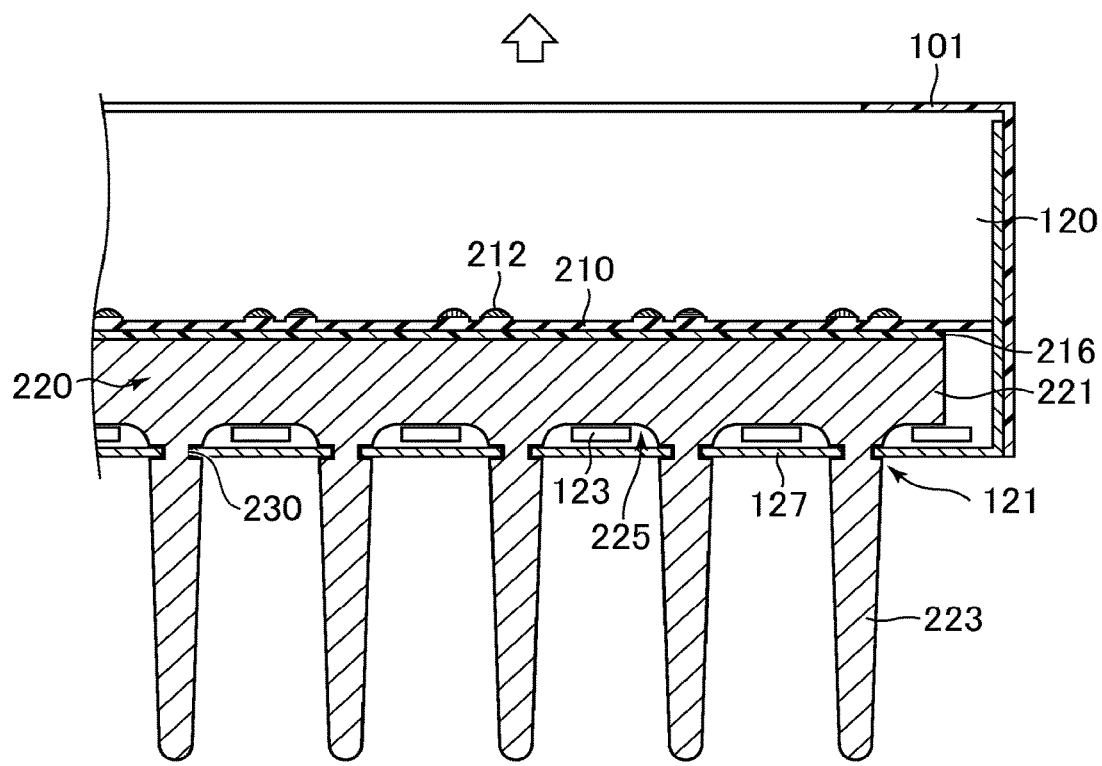
FIG. 5 is a partial cross-sectional view of the light source substrates and the heat sinks integrated with the frame and the mold frame, taken along the long sides of the bottom surface of the frame.

FIG. 5 is a partial cross-sectional view of the light source substrates 210 and the heat sinks 220 integrated with the frame 120 and the mold frame 101, cut along the long sides of the bottom surface 127 of the frame 120. As shown in the figure, each of fins 223 of the heat sink 220 is inserted into the corresponding one of the slits 121 in the frame 120 so that the heat sink 220 is assembled to the frame 120. Each fin 223 extends and tapers down in the rearward direction opposite to the display direction indicated by the arrow in FIG. 5. The dimensions of each slit 121 are designed so that the fins 223 of the heat sink 220 fit into the slits 121 when the gap between the base 221 of the heat sink 220 and the bottom surface 127 of the frame 120 reaches a predetermined gap. As shown in the figure, the air vents 123 in the side surface of the frame 120 are formed corresponding to ducts 225 that are each a tunnel-shaped space defined by the heat sink 220 and the frame 120 combined with each other. The air vents 123 in one of the side surfaces, the ducts 225, and the air vents 123 in the opposite side surface allow air or other gases to pass through them in this order, thus enhancing heat dissipation. Fitting and fixing the fins 223 into the slits 121 eliminates the need for alignment between them during manufacture and some manufacturing operations, such as reversing the frame 120 to direct the back surface upward and then fixing it with screws, thus greatly simplifying the entire manufacturing process. Consequently, this can reduce manufacturing costs and increase yields.

The ducts 225 in this embodiment are formed by fitting the fins 223 into the slits 121. Alternatively, the ducts 225 may be formed by other means, for example, by providing a spacer between the base 221 of the heat sink 220 and the bottom surface 127 of the frame 120. In particular, the ducts 225 may be formed by putting snap-fit notches 230 in the fins 223 of the heat sink 220 or in the frame 120 and by snapping the fins 223 of the heat sink 220 into the frame 120 to fix them together.

The slits 121 are provided corresponding one-to-one to the fins 223 in this embodiment, whereas each slit 121 may be provided for the corresponding two or more fins 223. In this case, providing at least two slits 121 for the heat sink 220 can form at least one duct 225, which also has the same effects as described above.

Figure 6:
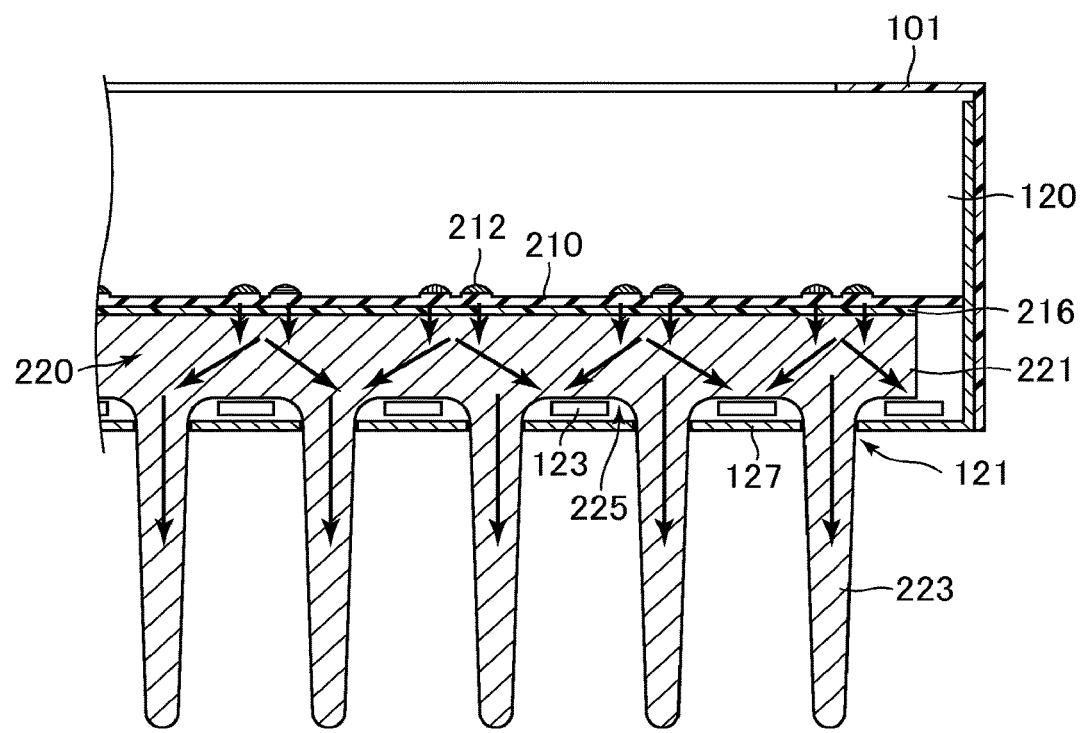
FIG. 6 is a diagram for explaining how the liquid crystal display device dissipates heat.

FIGS. 6 and 7 are diagrams for explaining how the liquid crystal display device 100 dissipates heat. FIG. 6 is a cross-sectional view from the same viewpoint as FIG. 5. As indicated by the arrows in this figure, the heat generated from each LED 212 is transferred to the base 221 of the heat sink 220, which is directly attached to the back surface of the light source substrate 210, exposed to the air from the base 221, and then efficiently transferred to the fins 223 for providing more effective cooling. A portion of the bottom surface 127 of the frame 120, arranged between two adjacent fins 223 extending from the base 221, is in contact with the heat sink 220. Therefore, the frame 120 also acts as a heat dissipator together with the heat sink 220 to enhance heat dissipation. Thus, the heat generated in LEDs 212 can be efficiently dissipated.

FIG. 7 is a partial cross-sectional view of the light source substrates 210 and the heat sinks 220 integrated with the frame 120 and the mold frame 101, taken along the short sides of the bottom surface 127 of the frame 120. Although most heat is dissipated from the fins 223 as described above, the remaining heat may stay in the base 221. In this embodiment, however, the base 221 of the heat sink 220 and the bottom surface 127 of the frame 120 define the ducts 225, which are each a tunnel-shaped space lying between two air vents 123 formed in the opposite side surfaces so as to allow air or other gases to pass through the two air vents 123. Therefore, the remaining heat can also be dissipated from the base 221. Improvement of heat dissipation can prevent deterioration of components caused by heat. The LEDs 212 and an IC on the light source substrate 210 particularly generate heat, so that cooling the ambient temperature is indispensable for extending product life.

To dissipate heat more efficiently, one of the two opposite air vents 123 may be provided with a fan for forced ventilation. Such a fan, which may be embedded in the heat sink 220 or the frame 120, can efficiently dissipate heat without increasing product size.

In this embodiment, some structures excellent in heat dissipation are proposed in view of an increase in heat generated by the LEDs 212 combined and arranged as shown in FIG. 4, although combination and arrangement of the LEDs 212 are not limited to those shown in FIG. 4. That is, such a structure can be applied, as a structure of the heat sinks 220 and the frame 120, to any backlight unit 200 that employs any colors and color combination of the LEDs 212, or any combination of the LEDs 212 and phosphors.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A back light comprising:
    a light source;
    a light source substrate arranged in a rearward direction opposite to a light exit direction of the light source;
    a heat sink arranged in the rearward direction from the light source substrate, the heat sink having a base attached to the light source substrate and a plurality of fins each extending in the rearward direction from the base, to dissipate heat generated in the light source; and
    a frame having a bottom surface arranged in the rearward direction from the base of the heat sink, the bottom surface having a plurality of slits into which the plurality of fins are inserted.

2. The back light according to claim 1, wherein
    the base of the heat sink is separated from the bottom surface of the frame by a gap so that the heat sink and the frame, combined with each other, define a tunnel-shaped duct, and
    the frame has air vents, corresponding to both edges of the duct, in side surfaces adjoining the bottom surface.

3. The back light according to claim 2, wherein
    the fins of the heat sink extend and taper down in the rearward direction, and
    the duct is defined by the fins fitted and fixed into the slits.

4. The back light according to claim 3, wherein the plurality of fins and the frame are fixed together by notches in the fins.

5. The back light according to claim 1, wherein the light source comprises three colors of light-emitting diodes: a red light-emitting diode, two green light-emitting diodes, and a blue light-emitting diode.

6. The back light according to claim 1, wherein each of the plurality of fins extends through a corresponding one of the slits.

7. A back light comprising:
    a plurality of light sources;
    a light source substrate having the plurality of light sources thereon;
    a heat sink attached to the light source substrate, the heat sink having a fin; and
    a frame having a slit and housing the light source substrate,
    wherein
    the light source substrate and the heat sink are bonded together, and
    the fin extends through the slit in the frame.

8. The back light according to claim 7, wherein the heat sink and the frame are formed to leave a gap therebetween.

9. The back light according to claim 7, wherein
    the fin of the heat sink tapers off to a point, and
    the fin is held by edges of the slit to form a duct.

10. The back light according to claim 9, wherein the fin and the frame are fixed together by notches in the fin.

11. The back light according to claim 9, wherein the frame has air vents corresponding to the duct.

12. The back light according to claim 7, wherein the plurality of light sources include light-emitting diodes of three colors, the three colors consisting of red, green and blue.

13. The back light according to claim 7, wherein the heat sink has a plurality of the fins.

14. The back light according to claim 13, wherein
    the frame has a plurality of the slits, and
    each of the plurality of fins extends through each of the plurality of slits.

* * * * *